United States Patent
Ryu et al.

(10) Patent No.: US 12,260,893 B2
(45) Date of Patent: Mar. 25, 2025

(54) SEMICONDUCTOR MEMORY MODULE AND DEVICE HAVING POWER MANAGEMENT UNIT FOR SUPPLYING STABLE AND ACCURATE VOLTAGES TO DRAM CHIP ARRAY

(71) Applicants: JM SEMICONDUCTOR. CO., LTD., Gyeonggi-do (KR); Sung Yun Ryu, Gyeonggi-do (KR); Sang Seok Kang, Gyeonggi-do (KR)

(72) Inventors: Sung Yun Ryu, Hwaseong-si (KR); Sang Seok Kang, Suwon-si (KR)

( * ) Notice: Subject to any disclaimer, the term of this patent is extended or adjusted under 35 U.S.C. 154(b) by 24 days.

(21) Appl. No.: 18/010,402

(22) PCT Filed: Nov. 22, 2021

(86) PCT No.: PCT/KR2021/017152
§ 371 (c)(1),
(2) Date: Dec. 14, 2022

(87) PCT Pub. No.: WO2022/124632
PCT Pub. Date: Jun. 16, 2022

(65) Prior Publication Data
US 2023/0298658 A1    Sep. 21, 2023

(30) Foreign Application Priority Data

Dec. 10, 2020    (KR) .......................... 10-2020-0172283

(51) Int. Cl.
*G11C 11/4074*    (2006.01)
(52) U.S. Cl.
CPC .............................. *G11C 11/4074* (2013.01)

(58) Field of Classification Search
None
See application file for complete search history.

(56) References Cited

U.S. PATENT DOCUMENTS

| 2008/0137444 A1* | 6/2008 | Mair ...................... G11C 5/147 365/226 |
| 2010/0214863 A1* | 8/2010 | Chan ...................... G11C 5/147 365/228 |

(Continued)

FOREIGN PATENT DOCUMENTS

KR    10-2176939    11/2020

OTHER PUBLICATIONS

International Search Report, with English translation, corresponding to International Application No. PCT/KR2021/017152 dated Mar. 3, 2022.

(Continued)

*Primary Examiner* — J. H. Hur
(74) *Attorney, Agent, or Firm* — KILE PARK REED & HOUTTEMAN PLLC

(57) ABSTRACT

The disclosure relates to a semiconductor memory device including a semiconductor memory module and a semiconductor memory control unit, and since the semiconductor memory module includes a power management unit, and the power management unit generates a reference voltage and various internal voltages to be supplied to a dynamic random access memory (DRAM) chip array, and receives the internal voltages supplied to the DRAM chip array by feedback to measure and compensate the internal voltages, a stable and accurate voltage can be supplied to the DRAM chip array.

4 Claims, 6 Drawing Sheets

(56) References Cited

U.S. PATENT DOCUMENTS

| | | |
|---|---|---|
| 2014/0146600 A1 | 5/2014 | Sohn et al. |
| 2019/0115053 A1 | 4/2019 | Park et al. |
| 2019/0272856 A1 | 9/2019 | Guo et al. |
| 2019/0385644 A1 | 12/2019 | Kang et al. |
| 2019/0385645 A1 | 12/2019 | Park et al. |
| 2021/0232166 A1* | 7/2021 | Feng ...................... G05F 1/575 |

OTHER PUBLICATIONS

Written Opinion for International Application No. PCT/KR2021/017152, dated Mar. 3, 2022.

* cited by examiner

SEMICONDUCTOR MEMORY MODULE AND DEVICE HAVING POWER MANAGEMENT UNIT FOR SUPPLYING STABLE AND ACCURATE VOLTAGES TO DRAM CHIP ARRAY

CROSS REFERENCE TO RELATED APPLICATION(S)

The application is a national entry of International Application No. PCT/KR2021/017152, filed on Nov. 22, 2021, which claims under 35 U.S.C. § 119(a) and 365(b) priority to and benefits of Korean Patent Application No. 10-2020-0172283, filed on Dec. 10, 2020, in the Korean Intellectual Property Office (KIPO), the entire contents of which are incorporated herein by reference.

BACKGROUND

1. Field of the Invention

The disclosure relates to a memory module and device including a power management unit capable of adjusting a source voltage supplied to a dynamic random access memory (DRAM).

2. Description of Related Art

Semiconductor memory devices widely used in high-performance electronic systems include a semiconductor memory module and a semiconductor memory control unit. The semiconductor memory module includes a volatile memory chip (for example, a random access memory (RAM), a dynamic RAM (DRAM), or the like) or a non-volatile memory chip (for example, a read only memory (ROM), a hard disk, NAND, NOR, or the like) to transmit/receive data through an external memory controller and channel, and receive power supply.

FIG. 1 is a schematic view for describing a conventional semiconductor memory device. As shown in the drawing, a semiconductor memory device 3000 can include a semiconductor memory module 1000 and a semiconductor memory control unit 2000.

The semiconductor memory module 1000 can receive a clock (CLK) signal or a chip select (CS) signal, a command (CMD) signal, and an address (ADDR) signal from the semiconductor memory control unit 2000 to transmit data stored in the DRAM to the semiconductor memory control unit 2000. Further, the semiconductor memory module 1000 can receive data from the semiconductor memory control unit 2000 to input the data to the DRAM.

The semiconductor memory module 1000 can transmit/receive data to and from the semiconductor memory control unit 2000 through one or more channels. The semiconductor memory control unit 2000 can control electrical operation through data communication with a host computer. The semiconductor memory control unit 2000 can provide a source voltage and a voltage regulation command signal to the semiconductor memory module 1000. A registering clock driver (RCD) 300 can perform a function of buffering the signal transmitted from the semiconductor memory control unit 2000.

The semiconductor memory module 1000 can include a DRAM array 100, a power management unit 200, and the registering clock driver (RCD) 300. The DRAM array 100 refers to a DRAM chip array, and can be a dual in-line memory module (DIMN) in which DRAM chips are packaged as an assembly of memories in which various types of data are stored. The DRAM can be a double data rate synchronous dynamic random access memory (DDR SDRAM), a low power double data rate (LPDDR) SDRAM, a graphics double data rate (GDDR) SDRAM, or a Rambus dynamic random access memory (RDRAM).

The power management unit (PMU) can be installed in the semiconductor memory module 1000 and receive a source voltage from the semiconductor memory control unit to generate a reference voltage, and can generate various internal voltages to supply the internal voltages to the DRAM chip array 100.

In order to achieve high-speed, high-reliability, and high-stability performance, as shown in the drawing, it is advantageous for the power management unit to be provided in the semiconductor memory module, rather than provided in the DRAM chip or the semiconductor memory control unit. However, since a function of measuring and compensating an output voltage of the power management unit, for example, an input voltage of the DRAM, is not disclosed, there is a problem in that the operation of the DRAM cannot be accurately controlled.

In Korean Patent Publication (Registration Publication No. 10-2176939, "Semiconductor memory module and device having power management unit"), a technology in which the semiconductor memory module includes a power management unit, and thus the power management unit generates a reference voltage and an internal voltage to be supplied to a DRAM chip array, and receives a voltage regulation command signal from a semiconductor memory control unit so that the internal voltage can be regulated to expand a product application range, reduce power consumption, and increase an operation speed is disclosed, but a technology of measuring and compensating an output voltage of the power management unit is not disclosed.

SUMMARY

The disclosure relates to a semiconductor memory module and a semiconductor memory device, and is directed to generating a voltage supplied to a dynamic random access memory (DRAM) chip array in the semiconductor memory module to supply the voltage to the DRAM, and causing a basic input output system (BIOS) to monitor and compensate the voltage so that a stable and accurate source voltage is supplied to the DRAM chip array.

A semiconductor memory module receiving a source voltage and a voltage regulation command signal from a semiconductor memory control unit to perform electrical operation includes: a dynamic random access memory (DRAM) array; and a power management unit supplying an internal voltage to the DRAM array, wherein the power management unit includes a reference voltage generator receiving the source voltage from a source voltage supplier of the semiconductor memory control unit to generate a reference voltage (Vref), a voltage regulation controller receiving the voltage regulation command signal from a voltage regulation commander of the semiconductor memory control unit to generate a control signal, an internal voltage generator receiving the reference voltage from the reference voltage generator and receiving the control signal from the voltage regulation controller to generate a cell array reference voltage (VrefA), an internal voltage driver receiving the cell array reference voltage (VrefA) from the internal voltage generator and stabilizing the cell array reference voltage (VrefA) to supply a cell array voltage (VDDA) to the DRAM array, and a voltage compensation unit receiving the cell array voltage (VDDA) by feedback to transmit a compensation command signal to the voltage regulation controller to supply a stable and accurate source voltage to the DRAM chip array.

In an embodiment, a semiconductor memory device comprising a semiconductor memory control unit and a semiconductor memory module receiving a source voltage and a voltage regulation command signal from the semiconductor memory control unit to perform electrical operation, wherein the semiconductor memory control unit includes: a source voltage supplier supplying the source voltage to the semiconductor memory module, and a voltage regulation commander configured to generating the voltage regulation command signal and providing the voltage regulation command signal to the semiconductor memory module, and the semiconductor memory module includes a DRAM array and a power management unit supplying the source voltage to the DRAM array, and the power management unit includes: a reference voltage generator receiving the source voltage from the source voltage supplier of the semiconductor memory control unit to generate a reference voltage (Vref), a voltage regulation controller receiving the voltage regulation command signal from the voltage regulation commander of the semiconductor memory control unit to generate a control signal, an internal voltage generator receiving the reference voltage from the reference voltage generator and receiving the control signal from the voltage regulation controller to generate a cell array reference voltage (VrefA), an internal voltage driver receiving the cell array reference voltage (VrefA) from the internal voltage generator and stabilizing the cell array reference voltage (VrefA) to supply a cell array voltage (VDDA) to the DRAM array, and a voltage compensation unit receiving the cell array voltage (VDDA) by feedback to transmit a compensation command signal to the voltage regulation controller or the voltage regulation commander.

BRIEF DESCRIPTION OF THE DRAWINGS

The above and other objects, features and advantages of the disclosure will become more apparent to those of ordinary skill in the art by describing in detail exemplary embodiments thereof with reference to the accompanying drawings, in which.

DETAILED DESCRIPTION OF THE EMBODIMENTS

Figure 1:
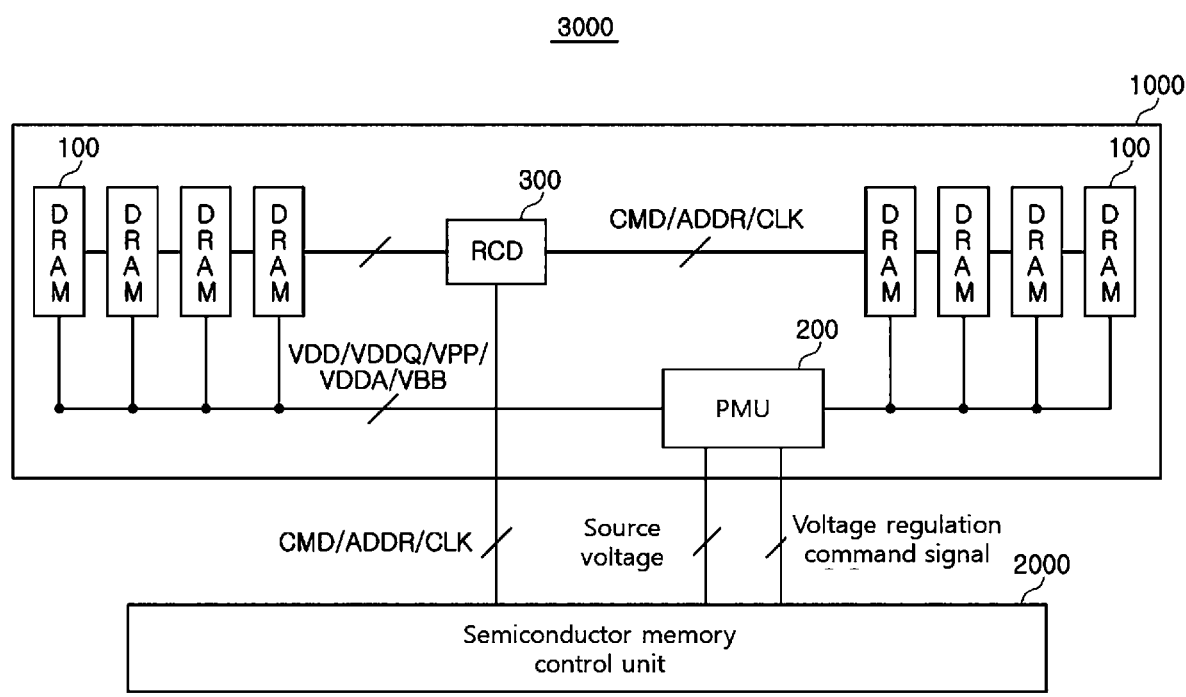
FIG. 1 is a schematic view for describing a conventional semiconductor memory device.

Hereinafter, the disclosure will be described in detail so that those skilled in the art may easily understand and reproduce the disclosure through embodiments described with reference to the accompanying drawings. In the description of the disclosure, when it is determined that detailed descriptions of a well-known function or configuration may unnecessarily obscure the principle of the disclosure, the detailed descriptions thereof will be omitted. Terms used throughout the specification of the disclosure are terms defined in consideration of functions in the embodiment of the disclosure, and since the terms may be sufficiently modified according to intentions or customs of users and operators, the definitions of these terms should be made based on the content throughout the specification.

The terminology used herein is for the purpose of describing particular embodiments and is not intended to be limiting. As used herein, the singular forms, "a", "an", and "the" are intended to include the plural forms as well, unless the context clearly indicates otherwise. Moreover, the terms "comprises", "comprising", "includes", and/or "including", when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially", "about", and other similar terms are used as terms of approximation and not as terms of degree, and, as such, are utilized to account for inherent deviations in measured, calculated, and/or provided values that would be recognized by one of ordinary skill in the art.

Further, the above-described aspects and additional aspects of the disclosure will become apparent through the embodiments to be described below. It is understood that configurations of the aspects or embodiments optionally disclosed in the specifications can be freely combined with each other even when shown as a single integrated configuration in the drawings unless a technical contradiction is apparent to those skilled in the art, unless otherwise disclosed. Accordingly, since the embodiments disclosed in the specification and the configurations shown in the drawings are merely an embodiment of the disclosure and do not represent all the technical spirit of the disclosure, it should be understood that there may be various equivalents and modifications at the time of filing the application.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Figure 2:
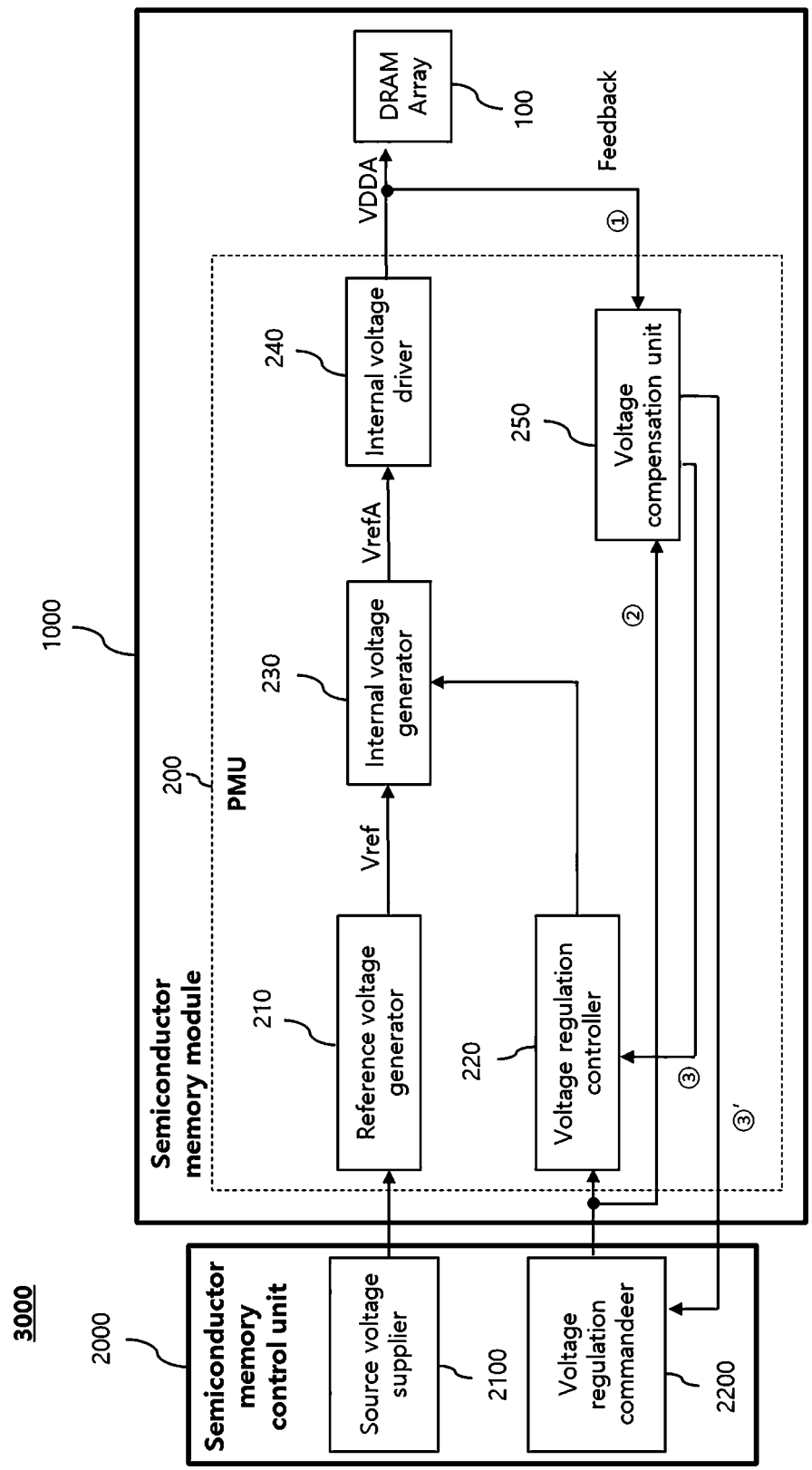
FIG. 2 is a schematic view for describing a semiconductor memory device including a semiconductor memory module including a power management unit, and a semiconductor memory control unit which controls the semiconductor memory module according to an embodiment.

FIG. 2 is a schematic view for describing a semiconductor memory device including a semiconductor memory module including a power management unit, and a semiconductor memory control unit which controls the semiconductor memory module according to an embodiment. As shown in the drawing, a semiconductor memory device 3000 may include a semiconductor memory control unit 2000 and a semiconductor memory module 1000 which receives a source voltage from the semiconductor memory control unit 2000 to perform electrical operation.

The semiconductor memory control unit 2000 may include a source voltage supplier 2100 which supplies a source voltage to the semiconductor memory module, and a voltage regulation commander 2200 which generates a voltage regulation command signal and provides the voltage regulation command signal to the semiconductor memory module. The voltage regulation commander 2200 may be configured as a basic input output system (BIOS).

The semiconductor memory module 1000 may include the dynamic random access memory (DRAM) array 100 and the power management unit 200 which supplies a source voltage to the DRAM array. The power management unit 200 may be implemented as a combination of application software and hardware in a power management integrated circuit (PMIC). The semiconductor memory module 1000 may receive the source voltage and the voltage regulation command signal from the semiconductor memory control unit to perform electrical operation.

The power management unit 200 may include a reference voltage generator 210, a voltage regulation controller 220, an internal voltage generator 230, an internal voltage driver 240, and a voltage compensation unit 250.

The reference voltage generator 210 may receive a source voltage from the source voltage supplier of the semiconductor memory control unit to generate a reference voltage Vref.

The voltage regulation controller 220 may receive the voltage regulation command signal from the voltage regulation commander of the semiconductor memory control unit to generate a control signal. The control signal generated by the voltage regulation controller 220 is a switching control signal, and may be an up/down or on/off signal. The voltage regulation controller 220 may be implemented in an analog method or may be implemented in a digital method.

The internal voltage generator 230 may receive a reference voltage from the reference voltage generator and receive the control signal from the voltage regulation controller to generate a cell array reference voltage VrefA.

The internal voltage driver 240 may receive the cell array reference voltage VrefA from the internal voltage generator and stabilize the cell array reference voltage VrefA to supply a cell array voltage VDDA to the DRAM array, The voltage driver may serve to constantly maintain an output voltage thereof. For example, when a device using this output voltage is switched from a standby state to an operating state, current consumption (power) increases instantaneously, which causes the voltage to drop, and the voltage driver may serve to increase the output voltage by comparing a difference between the voltage output through an own feedback circuit line and the reference voltage. On the other hand, when the output voltage increases, the voltage driver may serve to lower the voltage.

The voltage compensation unit 250 may receive the cell array voltage VDDA by feedback (①) and transmit a compensation command signal to the voltage regulation controller 220 (③).

The voltage compensation unit 250 provided in the semiconductor memory module 1000 may be provided inside or outside the PMIC. Even when the voltage compensation unit 250 is provided outside the PMIC, the voltage compensation unit 250 should be regarded as being included in the power management unit (PMU) 200.

Figure 3:
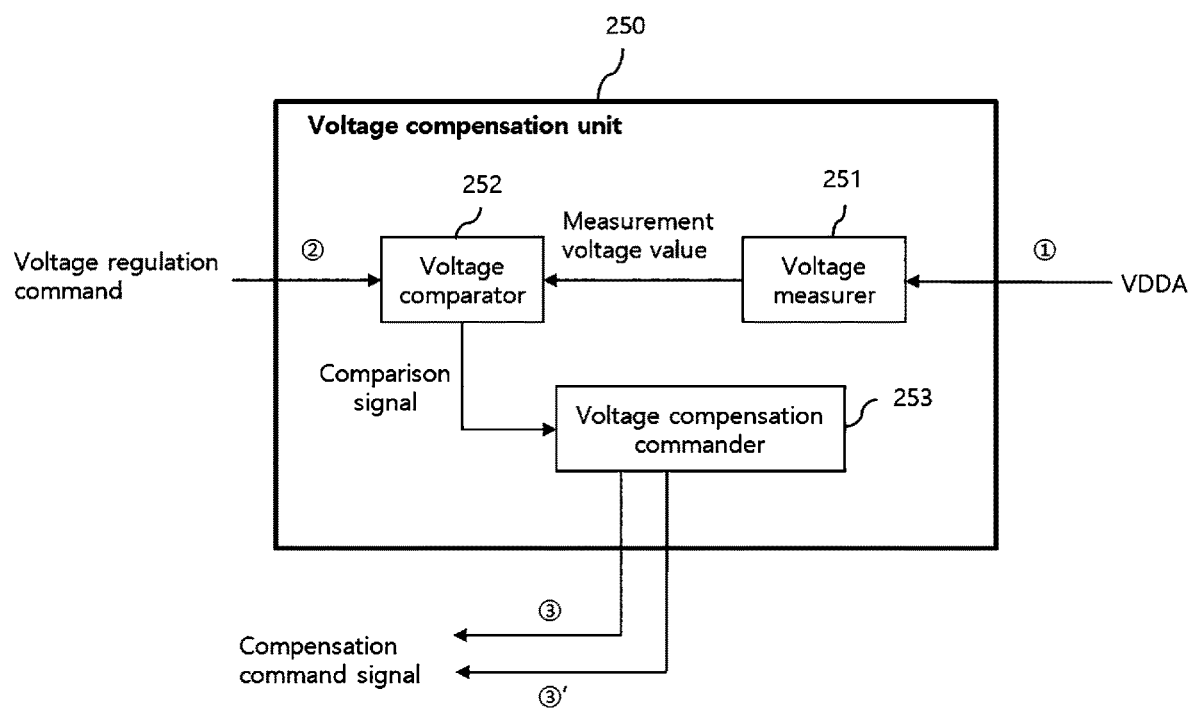
FIG. 3 is a schematic view for describing a voltage compensation unit according to and embodiment.

FIG. 3 is a schematic view for describing the voltage compensation unit according to an embodiment. As shown in the drawing, the voltage compensation unit 250 may include a voltage measurer 251, a voltage comparator 252, and a voltage compensation commander 253. Each of the voltage measurer 251, the voltage comparator 252, and the voltage compensation commander 253 may be configured as hardware or software.

The voltage measurer 251 may receive the cell array voltage VDDA by feedback (①) to measure a voltage value in real time and output a measurement voltage value. A measurement period may be appropriately determined in a range of about 0.1 ms to about 10 ms.

The voltage comparator 252 may receive the measurement voltage value, and compare the measurement voltage value and a reference voltage value acquired based on the voltage regulation command signal received from the voltage regulation commander (②) to output a comparison signal. The comparison signal may indicate information on a difference or a ratio of voltage values. For example, the VDDA may indicate information of 1.2 V−2 V=−0.02 V, and may also indicate information of −0.02 V/1.20 V=−1.7%.

The voltage compensation commander 253 may receive the comparison signal and transmit the compensation command signal to the voltage regulation controller 220 based on the comparison signal (③). In the above example, in the case of −0.02 V or −1.7%, a voltage up command to increase by +0.02 V or +1.7% may be given.

According to an embodiment, the voltage compensation commander 253 may receive the comparison signal and transmit the compensation command signal to the voltage regulation commander 2200 of the semiconductor memory control unit 2000 based on the comparison signal (③'). Whether the voltage compensation commander 253 will transmit the compensation command signal to the voltage regulation controller 220 (③) or the voltage compensation commander 253 will transmit the compensation command signal to the voltage regulation commander 2200 (③') may depend on information of the comparison signal.

Figure 4:
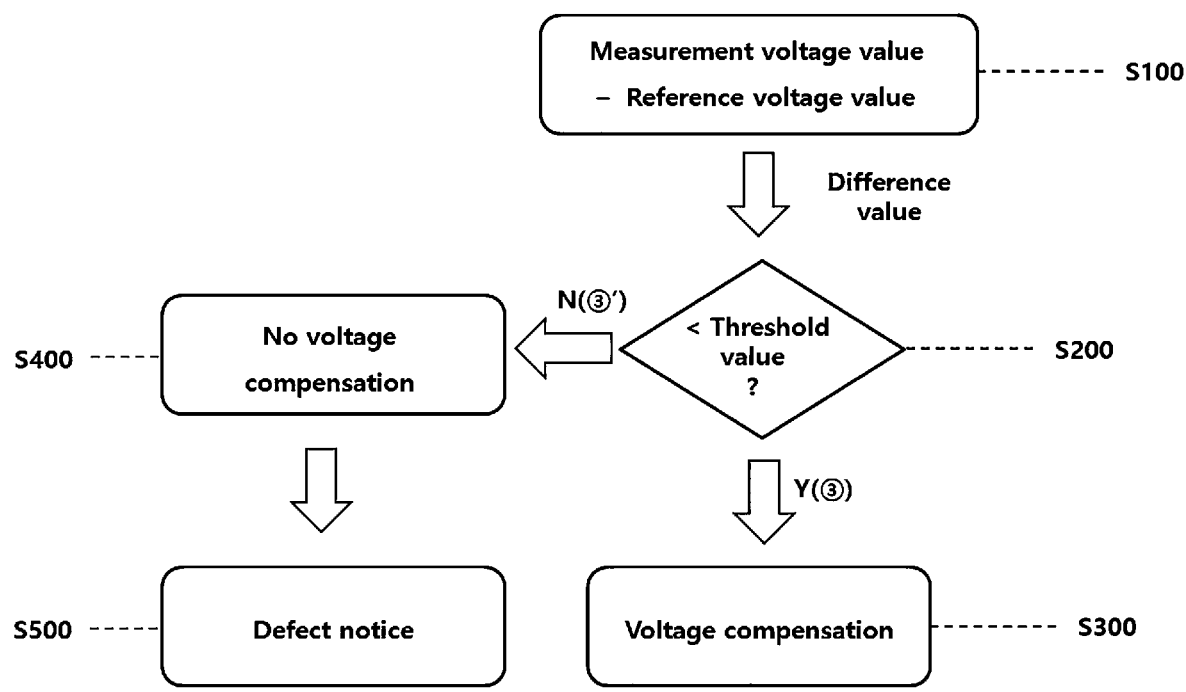
FIG. 4 is a schematic view for describing operations of a voltage compensation commander and a semiconductor memory device according to information of a comparison signal according to an embodiment.

FIG. 4 is a schematic view for describing operations of the voltage compensation commander 253 and the semiconductor memory device 3000 according to information of the comparison signal according to an embodiment. As a result of the voltage compensation commander 253 in FIG. 3 analyzing the information of the comparison signal (S100, S200), the voltage compensation commander 253 transmits the compensation command signal to the voltage regulation controller 220 (③) to perform voltage compensation (S300) when a difference value between the measurement voltage value and the reference voltage value is smaller than a threshold value (Y). For example, in the above example, when a threshold value is ±25%, ±1.7% is smaller than the threshold value.

However, when the difference value is greater than the threshold value (N), the voltage compensation commander 253 may transmit the compensation command signal to the voltage regulation commander 2200 (③') so as to not perform voltage compensation (No voltage Compensation, S400), and further, may provide a defect notice (a failure notification) to a host computer (not shown) (S500). In order to not perform voltage compensation, the voltage regulation commander 2200 may not transmit the voltage regulation command signal to the voltage regulation controller 220. For example, when the threshold value is ±25%, ±30% is greater than the threshold value.

Figure 5:
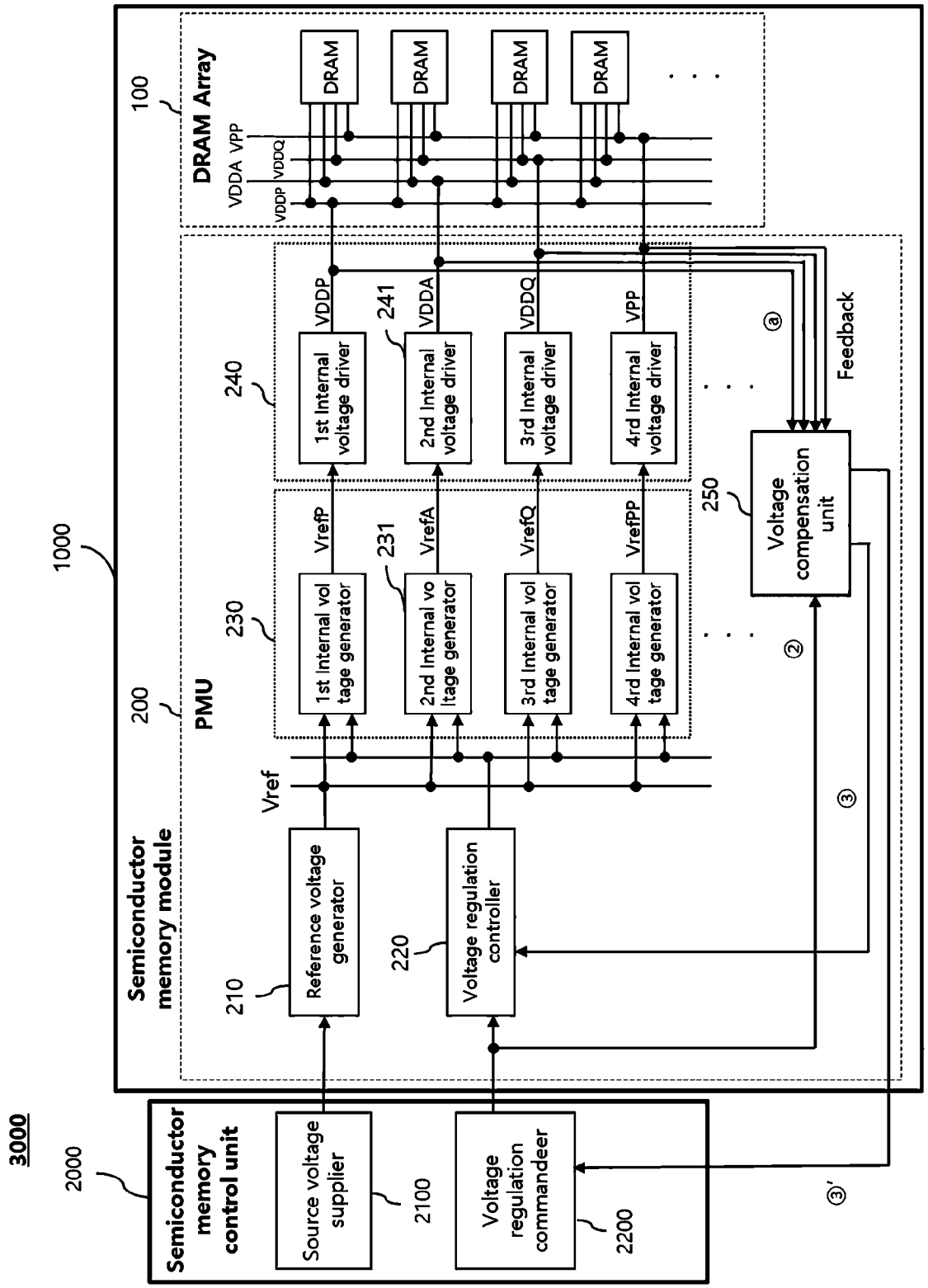
FIG. 5 is a schematic view for describing a semiconductor memory device including a semiconductor memory module including a power management unit which generates various internal voltages, and a semiconductor memory control unit which controls the semiconductor memory module according to another embodiment.

FIG. 5 is a schematic view for describing a semiconductor memory device including a semiconductor memory module including a power management unit which generates various internal voltages and a semiconductor memory control unit which controls the semiconductor memory module according to another embodiment. As shown in the drawing, a semiconductor memory device 3000 may include a semiconductor memory control unit 2000 and a semiconductor memory module 1000 which receives a source voltage from the semiconductor memory control unit to perform electrical operation.

The semiconductor memory control unit 2000 includes a source voltage supplier 2100 which supplies a source voltage to the semiconductor memory module, and a voltage regulation commander 2200 which generates a voltage regulation command signal and provides the voltage regulation command signal to the semiconductor memory module. The voltage regulation commander 2200 may be configured as a basic input output system (BIOS).

The semiconductor memory module 1000 may include a DRAM array 100 and a power management unit 200 which supplies a source voltage to the DRAM array. The power management unit 200 may be implemented as a combination of application software and hardware in a PMIC. The semiconductor memory module 1000 may receive the source voltage and the voltage regulation command signal from the semiconductor memory control unit to perform electrical operation.

The power management unit 200 may include a reference voltage generator 210, a voltage regulation controller 220, an internal voltage generator 230, an internal voltage driver 240, and a voltage compensation unit 250.

The reference voltage generator 210 may receive a source voltage from the source voltage supplier of the semiconductor memory control unit to generate a reference voltage Vref.

The voltage regulation controller 220 may receive the voltage regulation command signal from the voltage regulation commander of the semiconductor memory control unit to generate a control signal. The control signal generated by the voltage regulation controller 220 may be a switching control signal, and may be an up/down or on/off signal. The voltage regulation controller 220 may be implemented in an analog method or may be implemented in a digital method.

The internal voltage generator 230 may receive a reference voltage from the reference voltage generator and receive the control signal from the voltage regulation controller to generate a peripheral circuit reference voltage VrefP, a cell array reference voltage VrefA, a data output reference voltage VrefQ, and a word line (WL) reference voltage VrefPP. Like the above, the internal voltage generator 230 may be configured as sub-internal voltage generators to generate various internal voltages.

The internal voltage driver 240 may receive and stabilize the peripheral circuit reference voltage VrefP, the cell array reference voltage VrefA, the data output reference voltage VrefQ, and the word line (WL) reference voltage VrefPP from the internal voltage generator to supply a peripheral circuit voltage VDDP, a cell array voltage VDDA, a data output voltage VDDQ, and a word line (WL) voltage VPP to the DRAM array.

The voltage compensation unit 250 may receive each of the peripheral circuit voltage VDDP, the cell array voltage VDDA, the data output voltage VDDQ, and the word line (WL) voltage VPP by feedback (ⓐ) to transmit a compensation command signal to the voltage regulation controller.

The various internal voltages refer to voltages required for the DRAM chip array 100 to operate, and may include VDDA, VDDP, VDDQ, and VPP. The VDDA may be used as a power supply for a cell array in a DRAM chip, the VDDP may be used as a power supply for a peripheral circuit in the DRAM chip, the VDDQ may be used as a power supply for data output, and VPP may be used as a power supply for a word line (WL). The internal voltage may include VBB. The VBB refers to a back-bias voltage.

The voltage compensation unit 250 provided in the semiconductor memory module 1000 may be provided inside or outside the PMIC. Even when the voltage compensation unit 250 is provided outside the PMIC, the voltage compensation unit 250 should be regarded as being included in the power management unit (PMU) 200.

Figure 6:
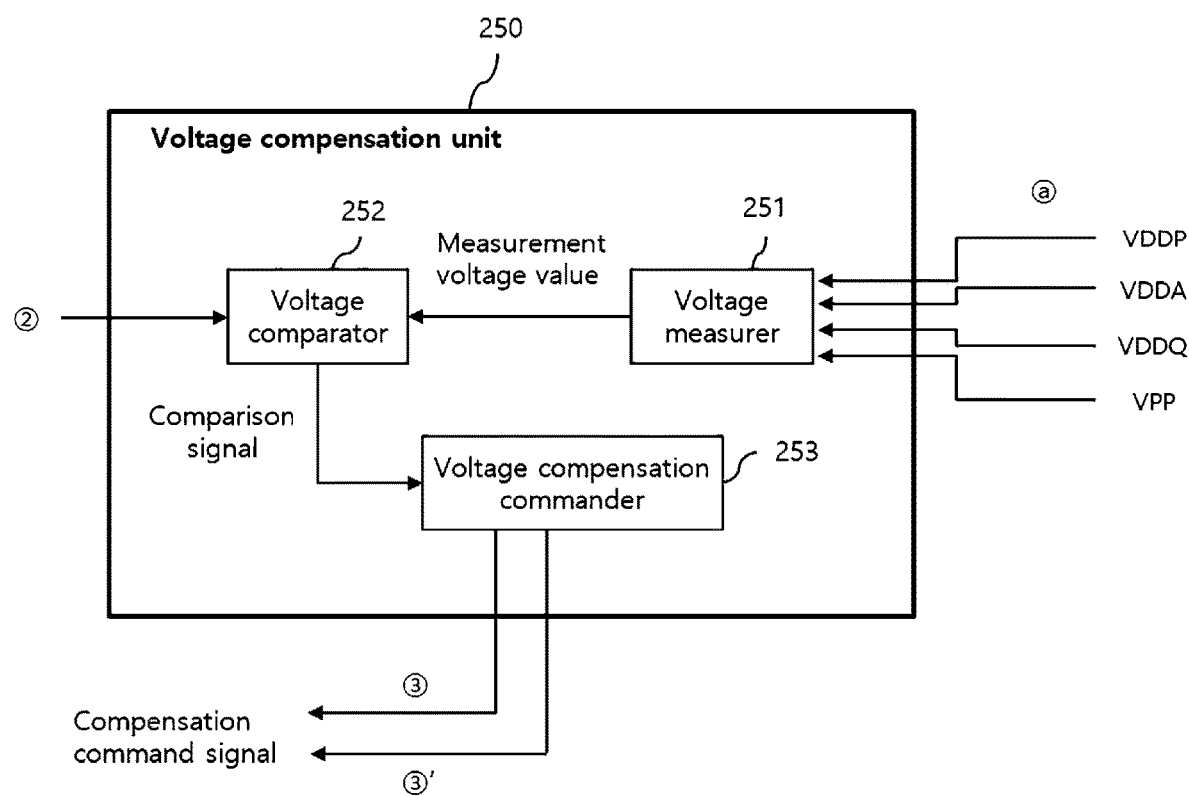
FIG. 6 is a schematic view for describing a voltage compensation unit according to still another embodiment.

FIG. 6 is a schematic view for describing a voltage compensation unit according to still another embodiment. As shown in the drawing, the voltage compensation unit 250 may include a voltage measurer 251, a voltage comparator 252, and a voltage compensation commander 253. Each of the voltage measurer 251, the voltage comparator 252, and the voltage compensation commander 253 may be configured as hardware or software.

The voltage measurer 251 may receive each of a peripheral circuit voltage VDDP, a cell array voltage VDDA, a data output voltage VDDQ, and a word line (WL) voltage VPP by feedback (ⓐ) and measure a voltage value of each of the peripheral circuit voltage VDDP, the cell array voltage VDDA, the data output voltage VDDQ, and the word line (WL) voltage VPP to output a measurement voltage value.

The voltage comparator 252 may receive the measurement voltage value, and compare the measurement voltage value and a reference voltage value acquired based on the voltage regulation command signal received from the voltage regulation commander (②) to output a comparison signal. The comparison signal may indicate information on a difference or a ratio of voltage values. For example, information of 1.2 V−1.22 V=−0.02 V may be indicated, and information of −0.02 V/1.20 V=−1.7% may also be indicated.

The voltage compensation commander 253 may receive the comparison signal and transmit the compensation command signal to the voltage regulation controller based on the comparison signal (③). In the above example, regarding VPP, in the case of −0.02 V or −1.7%, a voltage up command to increase by +0.02 V or +1.7% may be given. Regarding VDDQ, in the case of +0.02 V or +1.7%, a voltage down command to decrease by 0.02 V or 1.7% may be given.

According to an embodiment, the voltage compensation commander 253 may receive the comparison signal and transmit the compensation command signal to the voltage regulation commander 2200 of the semiconductor memory control unit 2000 based on the comparison signal (③'). Whether the voltage compensation commander 253 will transmit the compensation command signal to the voltage regulation controller 220 (③) or the voltage compensation commander 253 will transmit the compensation command signal to the voltage regulation commander 2200 (③') may depend on information of the comparison signal. A specific operation follows FIG. 3 and a description thereof. Accordingly, as various internal voltages input to the DRAM chip array through a feedback circuit are individually measured and compensated, the internal voltages may be accurately and stably supplied to the DRAM chip array.

In the disclosure, as a voltage (for example, VDDA) used in a dynamic random access memory (DRAM) array is not generated in the DRAM array, but is generated by an external power management unit and supplied to the DRAM array, voltage regulation is easy, and thus various voltages can be supplied to DRAM arrays for products such as servers, games, and mobile devices, or the like. Accordingly, the application range of products or applications can be expanded.

Further, since the voltage supplied to the DRAM array can be supplied by feedback from an output of the power management unit and sensed to be monitored and compensated, a stable and accurate voltage can be supplied to the DRAM array in real time.

As each of various types of voltages (for example, VDDP, VDDA, VDDQ, and VPP) used in the DRAM array is generated and controlled in the power management unit, it is more advantageous for expanding the application range of products or applications, and a volume of the DRAM array can be reduced.

Since the voltages input to the DRAM array are provided to a semiconductor memory control unit (BIOS) by feedback, it is advantageous for controlling and compensating the voltage.

The above description is an example of technical features of the disclosure, and those skilled in the art to which the disclosure pertains will be able to make various modifications and variations. Thus, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A semiconductor memory module receiving a source voltage and a voltage regulation command signal from a semiconductor memory control unit to perform electrical operation comprising:
   a dynamic random access memory (DRAM) array; and
   a power management unit supplying a cell array voltage to the DRAM array, wherein
   the power management unit includes:
      a reference voltage generator receiving the source voltage from a source voltage supplier of the semiconductor memory control unit to generate a reference voltage (Vref);
      a voltage regulation controller receiving the voltage regulation command signal from a voltage regulation commander of the semiconductor memory control unit to generate a control signal;
      an internal voltage generator receiving the reference voltage from the reference voltage generator and receiving the control signal from the voltage regulation controller to generate a cell array reference voltage (VrefA);
      an internal voltage driver receiving the cell array reference voltage (VrefA) from the internal voltage generator and stabilizing the cell array reference voltage (VrefA) to supply a cell array voltage (VDDA) to the DRAM array; and
      a voltage compensation unit receiving the cell array voltage (VDDA) by feedback to transmit a compensation command signal to the voltage regulation controller, and
   the voltage compensation unit includes:
      a voltage measurer receiving the cell array voltage (VDDA) by feedback to measure a voltage value and outputting a measurement voltage value;
      a voltage comparator receiving the measurement voltage value, and comparing the measurement voltage value and a reference voltage value acquired based on the voltage regulation command signal received from the voltage regulation commander to output a comparison signal; and
      a voltage compensation commander receiving the comparison signal and transmitting the compensation command signal to the voltage regulation controller based on the comparison signal.

2. A semiconductor memory device comprising a semiconductor memory control unit and a semiconductor memory module receiving a source voltage and a voltage regulation command signal from the semiconductor memory control unit to perform electrical operation, wherein
   the semiconductor memory control unit includes:
      a source voltage supplier supplying the source voltage to the semiconductor memory module; and
      a voltage regulation commander generating the voltage regulation command signal and providing the voltage regulation command signal to the semiconductor memory module, and
   the semiconductor memory module includes a DRAM array and a power management unit supplying the cell array voltage to the DRAM array,
   the power management unit includes:
      a reference voltage generator receiving the source voltage from the source voltage supplier of the semiconductor memory control unit to generate a reference voltage (Vref);
      a voltage regulation controller receiving the voltage regulation command signal from the voltage regulation commander of the semiconductor memory control unit to generate a control signal;
      an internal voltage generator receiving the reference voltage from the reference voltage generator and receiving the control signal from the voltage regulation controller to generate a cell array reference voltage (VrefA);
      an internal voltage driver receiving the cell array reference voltage (VrefA) from the internal voltage generator and stabilizing the cell array reference voltage (VrefA) to supply a cell array voltage (VDDA) to the DRAM array; and
      a voltage compensation unit receiving the cell array voltage (VDDA) by feedback to transmit a compensation command signal to the voltage regulation controller or the voltage regulation commander, and
   the voltage compensation unit includes:
      a voltage measurer receiving the cell array voltage (VDDA) by feedback to measure a voltage value and outputting a measurement voltage value;
      a voltage comparator receiving the measurement voltage value, and comparing the measurement voltage value and a reference voltage value acquired based on the voltage regulation command signal received from the voltage regulation commander to output a comparison signal; and a voltage compensation commander receiving the comparison signal and transmitting the compensation command signal to the voltage regulation controller based on the comparison signal.

3. The semiconductor memory device of claim 2, wherein the voltage regulation commander is controlled so as not to generate the voltage regulation command signal when the voltage compensation commander transmits the compensation command signal to the voltage regulation commander.

4. A semiconductor memory device comprising a semiconductor memory control unit and a semiconductor memory module receiving a source voltage and a voltage regulation command signal from the semiconductor memory control unit to perform electrical operation, wherein
the semiconductor memory control unit includes:
a source voltage supplier supplying the source voltage to the semiconductor memory module; and
a voltage regulation commander generating the voltage regulation command signal and providing the voltage regulation command signal to the semiconductor memory module, and
the semiconductor memory module includes a DRAM array and a power management unit supplying the source array voltage to the DRAM array,
the power management unit includes:
a reference voltage generator receiving the source voltage from the source voltage supplier of the semiconductor memory control unit to generate a reference voltage (Vref);
a voltage regulation controller receiving the voltage regulation command signal from the voltage regulation commander of the semiconductor memory control unit to generate a control signal;
an internal voltage generator receiving the reference voltage from the reference voltage generator and receiving the control signal from the voltage regulation controller to generate a peripheral circuit reference voltage (VrefP), a cell array reference voltage (VrefA), a data output reference voltage (VrefQ), and a word line (WL) reference voltage (VrefPP);
an internal voltage driver receiving and stabilizing the peripheral circuit reference voltage (VrefP), the cell array reference voltage (VrefA), the data output reference voltage (VrefQ), and the word line (WL) reference voltage (VrefPP) from the internal voltage generator to supply a peripheral circuit voltage (VDDP), a cell array voltage (VDDA), a data output voltage (VDDQ), and a word line (WL) voltage (VPP) to the DRAM array; and
a voltage compensation unit receiving each of the peripheral circuit voltage (VDDP), the cell array voltage (VDDA), the data output voltage (VDDQ), and the word line (WL) voltage (VPP) by feedback to transmit a compensation command signal to the voltage regulation controller, and
the voltage compensation unit includes:
a voltage measurer receiving each of the peripheral circuit voltage (VDDP), the cell array voltage (VDDA), the data output voltage (VDDQ), and the word line (WL) voltage (VPP) by feedback to measure a voltage value and outputting each measurement voltage value;
a voltage comparator receiving the measurement voltage value, and comparing the measurement voltage value and a reference voltage value acquired based on the voltage regulation command signal received from the voltage regulation commander to output a comparison signal; and
a voltage compensation commander receiving the comparison signal and transmitting the compensation command signal to the voltage regulation controller based on the comparison signal.

\* \* \* \* \*